(12) United States Patent
Memisevic et al.

(10) Patent No.: US 12,635,428 B2
(45) Date of Patent: May 19, 2026

(54) SHADOW WALLS FOR USE IN FABRICATING DEVICES

(71) Applicant: Microsoft Technology Licensing, LLC, Redmond, WA (US)

(72) Inventors: Elvedin Memisevic, Delft (NL); Amrita Singh, Delft (NL); Pavel Aseev, Delft (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 832 days.

(21) Appl. No.: 17/904,794

(22) PCT Filed: Feb. 28, 2020

(86) PCT No.: PCT/EP2020/055338
§ 371 (c)(1),
(2) Date: Aug. 23, 2022

(87) PCT Pub. No.: WO2021/170251
PCT Pub. Date: Sep. 2, 2021

(65) Prior Publication Data
US 2023/0106283 A1      Apr. 6, 2023

(51) Int. Cl.
*H10P 14/20*           (2026.01)
*G03F 7/004*          (2006.01)
(Continued)

(52) U.S. Cl.
CPC ............ *H10P 14/271* (2026.01); *G03F 7/004* (2013.01); *G03F 7/2059* (2013.01);
(Continued)

(58) Field of Classification Search
None
See application file for complete search history.

(56) References Cited

U.S. PATENT DOCUMENTS

| | | |
|---|---|---|
| 4,145,699 A | 3/1979 | Hu et al. |
| 4,218,532 A | 8/1980 | Dunkleberger |

(Continued)

FOREIGN PATENT DOCUMENTS

| | | |
|---|---|---|
| CN | 1253311 A | 5/2000 |
| CN | 104769732 A | 7/2015 |

(Continued)

OTHER PUBLICATIONS

Machine translation of Jp 2002-009145A, published on Jan. 11, 2002 (Year: 2002).*

(Continued)

*Primary Examiner* — Anca Eoff
(74) *Attorney, Agent, or Firm* — Alleman Hall LLP

(57) ABSTRACT

A shadow wall for controlling directional deposition of a material is arranged on a substrate. The shadow wall comprises a base portion and a bridge portion. The base portion is arranged on the substrate and is configured to support the bridge portion. The bridge portion overhangs the substrate. The shadow wall may have improved compatibility with non-directional deposition processes, because adatoms on the surface of the substrate may diffuse under the bridge. Also provided are a method of fabricating a device using the shadow wall, and a method of fabricating the shadow wall.

14 Claims, 7 Drawing Sheets

(51) Int. Cl.
  *G03F 7/20*    (2006.01)
  *H10D 62/10*   (2025.01)
  *H10P 14/22*   (2026.01)
(52) U.S. Cl.
  CPC ....... *H10D 62/121* (2025.01); *H10P 14/3411*
      (2026.01); *H10P 14/22* (2026.01)

(56) References Cited

U.S. PATENT DOCUMENTS

| | | | |
|---|---|---|---|
| 4,673,960 | A | 6/1987 | Chao et al. |
| 5,468,595 | A | 11/1995 | Livesay |
| 8,563,395 | B2 | 10/2013 | Mi |
| 10,629,798 | B1 | 4/2020 | Kallaher et al. |
| 11,024,792 | B2 | 6/2021 | Ramakers et al. |
| 11,296,145 | B2 | 4/2022 | Van Hoogdalem et al. |
| 2003/0118950 | A1 | 6/2003 | Chao et al. |
| 2003/0180474 | A1 | 9/2003 | Nishikawa |
| 2006/0046201 | A1 | 3/2006 | Sandhu |
| 2007/0069273 | A1 | 3/2007 | Rohr |
| 2011/0165327 | A1 | 7/2011 | Park et al. |
| 2013/0217565 | A1 | 8/2013 | Kastalsky |
| 2017/0250381 | A1 | 8/2017 | Okawara |
| 2018/0090662 | A1 | 3/2018 | Stevenson et al. |
| 2018/0358537 | A1 | 12/2018 | Brink et al. |
| 2018/0358538 | A1 | 12/2018 | Brink et al. |
| 2019/0204753 | A1 | 7/2019 | Burkett |
| 2020/0243742 | A1 | 7/2020 | Ramakers et al. |
| 2021/0296560 | A1 | 9/2021 | Ramakers et al. |
| 2022/0157932 | A1 | 5/2022 | Jespersen et al. |
| 2023/0008296 | A1 | 1/2023 | Aseev et al. |

FOREIGN PATENT DOCUMENTS

| | | | | |
|---|---|---|---|---|
| CN | 109844637 | A | | 6/2019 |
| DE | 102017002616 | A1 | | 9/2018 |
| EP | 3475760 | A1 | | 5/2019 |
| JP | 59002349 | A | * | 1/1984 |
| JP | 2002009045 | A | * | 1/2002 |
| KR | 20150120543 | A | | 10/2015 |
| KR | 20150120546 | A | | 10/2015 |
| KR | 101757736 | B1 | | 7/2017 |
| WO | WO-9611878 | A1 | * | 4/1996 ............ C40B 80/00 |
| WO | 2009029302 | A2 | | 3/2009 |
| WO | 2017217961 | A1 | | 12/2017 |
| WO | 2019001753 | A1 | | 1/2019 |
| WO | 2019099171 | A2 | | 5/2019 |
| WO | 2021110275 | A1 | | 6/2021 |
| WO | 2021112856 | A1 | | 6/2021 |

OTHER PUBLICATIONS

Machine translation of the abstract of JP59-002349A, published on Jan. 7, 1984 (Year: 1984).*

Desbiolles, et al., "Ion beam etching redeposition for 3D multimaterial nanostructure manufacturing", Microsystems & Nanoengineering, vol. 5, Issue 11, Retrieved from URL: https://doi.org/10.1038/s41378-019-0052-7, 2019, pp. 1-8.

Final Office Action mailed on Aug. 27, 2024, in U.S. Appl. No. 17/756,812, 12 pages.

First Office Action Received for Chinese Application No. 202080009378.1, mailed on Jun. 26, 2024, 15 pages. (English Translation Provided).

Notice of Allowance mailed on Aug. 7, 2024, in U.S. Appl. No. 17/332,908, 8 pages.

Office Action Received for Australian Application No. 2020211895, mailed on Sep. 3, 2024, 3 pages.

Desbiolles, et al., "Ion beam etching redeposition for 3D multimaterial nanostructure manufacturing", Microsystems & Nanoengineering, Apr. 22, 2019, 08 Pages.

Office Action Received for Australian Application No. 2020211895, mailed on Mar. 19, 2025, 3 pages.

Office Action Received for Chinese Application No. 2019801026866, mailed on Mar. 1, 2025, 16 pages. (English Translation Provided).

"Notice of Allowance Issued in U.S. Appl. No. 16/246,289", Mailed Date: Dec. 16, 2019, 8 Pages.

"Non Final Office Action Issued in U.S. Appl. No. 16/258,025", Mailed Date: Apr. 30, 2020, 12 Pages.

"Notice of Allowance Issued in U.S. Appl. No. 16/258,025", Mailed Date: Feb. 4, 2021, 8 Pages.

"Notice of Allowance Issued in U.S. Appl. No. 16/258,025", Mailed Date: Oct. 19, 2020, 7 Pages.

Fan, et al., "Semiconductor Nanowires: From Self-Organization to Patterned Growth", In Journal of Small, vol. 2, Issue 6, Jun. 2006, pp. 700-717.

Goh, Wui H., "Selective Area Growth and Characterization of Gan Based Nanostructures by Metal Organic Vapor Phase Epitaxy", In Thesis of Georgia Institute of Technology, May 2013, 121 Pages.

Krizek, et al., "Field Effect Enhancement in Buffered Quantum Nanowire Networks", In Journal of Physical Review Materials, vol. 2, Issue 9, Sep. 7, 2018, 15 Pages.

Krizek, Filip, "Semiconductor Nanowire Networks Grown by Molecular Beam Epitaxy", In PhD Thesis of University Of Copenhagen, Jul. 20, 2018, 190 Pages.

Liu, et al., "Fabrication of Microelectrodes on Diamond Anvil for the Resistance Measurement in High Pressure Experiment", In Article Microsystem Technologies, vol. 24, Issue 7, Jul. 1, 2018, pp. 3193-3199.

Liu, et al., "Top-Down Fabrication of Nanostructures", Retrieved from: https://application.wiley-vch.de/books/sample/3527317392_c01.pdf, May 1, 2018, 48 Pages.

Serban, Elena A., "Self-Assembled and Selective-Area Growth of Group III-Nitride Semiconductor Nanorods by Magnetron Sputter Epitaxy", In Doctoral Dissertation of Linkoping University, May 3, 2018, 66 Pages.

Schallenberg, Timo, "Shadow Mask Assisted Heteroepitaxy of Compound Semiconductor Nanostructures", In Doctoral Dissertation of Bavarian Julius-Maximilians-University, Oct. 2, 2004, 135 Pages.

"International Search Report and Written Opinion Issued in PCT Application No. PCT/US20/014202", Mailed Date: Jun. 25, 2020, 18 Pages.

"International Search Report and Written Opinion Issued in PCT Application No. PCT/US19/069024", Mailed Date: Jul. 9, 2020, 10 Pages.

"International Search Report and Written Opinion Issued in PCT Application No. PCT/US19/064705", Mailed Date: Sep. 28, 2020, 18 Pages.

"Extended Search Report Issued in European Patent Application No. 22167178.7", Mailed Date: Jul. 14, 2022, 4 Pages.

"Extended Search Report Issued in European Patent Application No. 22167181.1", Mailed Date: Jul. 12, 2022, 10 Pages.

"Evaporation (deposition)", Retrieved from: https://en.wikipedia.org/wiki/Evaporation_(deposition), Feb. 15, 2020, 1 Pages.

"Mean Free Path", Retrieved from: https://www.pfeiffer-vacuum.com/en/know-how/introduction-to-vacuum-technology/fundamentals/mean-free-path/, Retrieved On: Mar. 26, 2020, 8 Pages.

Ariel-Sternberg, Nava, "PMMA Resist Processing Standard Operating Procedure", Retrieved from: https://static1.squarespace.com/static/57b26cc76b8f5b7524bf9ed2/t/59272752d2b857857ae994c6/1495738198009/PMMA_Process_SOP_May2017.pdf, May 2017, 6 Pages.

Aseev, et al., "Selectivity Map for Molecular Beam Epitaxy of Advanced III-V Quantum Nanowire Networks", In Journal of Nano Letters, vol. 19, Issue 1, Dec. 6, 2018, pp. 218-227.

Davies, et al., "Selective Area Growth of III-V Semiconductors by Chemical Beam Epitaxy: Study of Reaction Mechanisms", In Journal of Epitaxial Growth Processes, vol. 2140, May 11, 1994, pp. 58-67.

Etsu, Shin, "The Difference Between Positive and Negative Photoresist", Retrieved from: http://web.archive.org/web/20191130013210/https://www.microsi.com/the-difference-between-positive-and-negative-photoresist/, Mar. 5, 2013, 2 Pages.

(56)          References Cited

OTHER PUBLICATIONS

Fahed, Maria, "Selective Area Growth of In-Plane III-V Nanostructures Using Molecular Beam Epitaxy", Thesis Submitted to University of Lille, Nov. 24, 2016, 140 Pages.

Fukui, et al., "GaAs Tetrahedral Quantum Dot Structures Fabricated Using Selective Area Metalorganic Chemical Vapor Deposition", In Journal of Applied Physics Letters, vol. 58, Issue 18, May 6, 1991, 4 Pages.

"Notice of Allowance Issued in European Patent Application No. 19880935.2", Mailed Date: Aug. 9, 2022, 7 Pages.

"International Search Report & Written Opinion issued in PCT Application No. PCT/EP20/055338", Mailed Date: Nov. 2, 2020, 15 Pages.

Marinins, et al., "Air-Suspended SU-8 Strip Waveguides With High Refractive Index Contrast", In Journal of Photonics Technology Letters vol. 28, Issue 17, Sep. 1, 2016, pp. 1862-1865.

Lyu, et al., "Downscaling Metal—Oxide Thin-Film Transistors to Sub-50 nm in an Exquisite Film-Profile Engineering Approach", In Journal of IEEE Transactions on Electron Devices, vol. 64, Issue 3, Mar. 2017, pp. 1069-1075.

Notice of First Office Action Received for Chinese Application No. 201980088591.3, mailed on Apr. 3, 2024, 12 pages (English Translation Provided).

Non-Final Office Action mailed on Apr. 26, 2024, in U.S. Appl. No. 17/756,812, 09 pages.

"Non Final Office Action Issued in U.S. Appl. No. 17/332,908", Mailed Date: Apr. 12, 2023, 10 Pages.

"Notice of Allowance Issued in European Patent Application No. 22167178.7", Mailed Date: Mar. 30, 2023, 8 Pages.

"Extended European Search Report Issued in European Patent Application No. 22179312.8", Mailed Date: Oct. 20, 2022, 12 Pages.

"Notice of Allowance Issued in European Patent Application No. 19880935.2", Mailed Date: Dec. 8, 2022, 2 Pages.

"Office Action Issued in Indian Patent Application No. 202147029260", Mailed Date: Feb. 2, 2023, 5 Pages.

"Office Action Issued in Indian Patent Application No. 202147032428", Mailed Date: Feb. 21, 2023, 5 Pages.

Office Action Received for Korean Application No. 10-2021-7022655, mailed on Feb. 29, 2024, 10 pages (English Translation Provided).

"Notice of Allowance Issued in European Patent Application No. 22167178.7", Mailed Date: Jul. 20, 2023, 2 Pages.

Non-Final Office Action mailed on Apr. 10, 2024, in U.S. Appl. No. 17/332,908, 10 pages.

Guarnieri, et al., "Platinum metallization for MEMS application", Biomatter, vol. 4, Issue 1, 2014, 8 pages.

Notice Of Allowance mailed on Jan. 29, 2024, in U.S. Appl. No. 17/332,908, 8 pages.

Office Action Received for Korea Application No. 10-2022-7022916, mailed on Feb. 22, 2024, 16 pages (English Translation Provided).

Office Action Received for Korean Application No. 10-2021-7019145, mailed on Feb. 20, 2024, 25 pages (English Translation Provided).

Requirement for Restriction mailed on Feb. 5, 2024, in U.S. Appl. No. 17/756,812, 9 pages.

U.S. Appl. No. 16/246,289, filed Jan. 11, 2019.

U.S. Appl. No. 17/332,908, filed May 27, 2021.

U.S. Appl. No. 16/258,025, filed Jan. 25, 2019.

U.S. Appl. No. 17/756,812, filed Dec. 5, 2019.

U.S. Appl. No. 17/382,174, filed Jul. 21, 2021.

U.S. Appl. No. 16/484,088, filed Oct. 26, 2018.

U.S. Appl. No. 17/904,798, filed Feb. 28, 2020.

U.S. Appl. No. 17/904,798, filed Aug. 23, 2022.

"Notice of Allowance Issued in U.S. Appl. No. 17/332,908", Mailed Date: Sep. 27, 2023, 7 Pages.

\* cited by examiner

SHADOW WALLS FOR USE IN FABRICATING DEVICES

CROSS REFERENCE TO RELATED APPLICATIONS

The present application is a U.S. National Phase of International Patent Application Serial No. PCT/EP2020/055338 entitled "SHADOW WALLS FOR USE IN FABRICATING DEVICES", filed Feb. 28, 2020.

BACKGROUND

Directional deposition processes such as molecular beam epitaxy are techniques which have been used to grow materials on substrates.

Selective area growth is a technique used to form nano-structures with a controlled shape and location by applying a patterned amorphous mask to the substrate and then growing a crystal in an area left exposed by the mask.

Molecular beam epitaxy is a method for depositing thin film single crystals onto a substrate. This method involves heating a material to be deposited such that it enters the gaseous phase thereby generating a beam which, when directed to the substrate, allows the material to condense on the substrate. The method is conducted at very low pressures: evaporated atoms having long mean free paths, such that they do not interact before reaching the substrate.

SUMMARY

In one aspect, there is provided a shadow wall for controlling directional deposition of a material arranged on a substrate. The shadow wall comprises a base portion and a bridge portion. The base portion is arranged on the substrate and is configured to support the bridge portion. The bridge portion overhangs the substrate. The shadow wall may have improved compatibility with non-directional deposition processes, because adatoms on the surface of the substrate may diffuse under the bridge portion.

In another aspect, there is provided a method of fabricating a device, which method comprises: fabricating a shadow wall as provided herein; and directionally depositing a material from a direction selected such that the shadow wall casts a shadow on the substrate, the shadow being a region in which the material is not deposited.

A still further aspect provides a method of fabricating a shadow wall on a substrate, the shadow wall comprising a base portion and a bridge portion, which method comprises: forming a first resist on the substrate; selectively exposing a portion of the first resist and developing the first resist to form a mask defining a channel; forming a second resist in the channel and over the mask, wherein the first resist and the second resist comprise different materials; selectively exposing a portion of the second resist, developing the second resist, and removing the mask to form the shadow wall; wherein the base portion is formed in the channel; wherein the base portion supports the bridge portion; and wherein the bridge portion overhangs the substrate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIGS. 1, 2, 4, 6 and 9 are schematic, and are not to scale. The relative proportions of components shown in these FIGS. may be exaggerated for ease of representation.

DETAILED DESCRIPTION OF EMBODIMENTS

Figure 1:
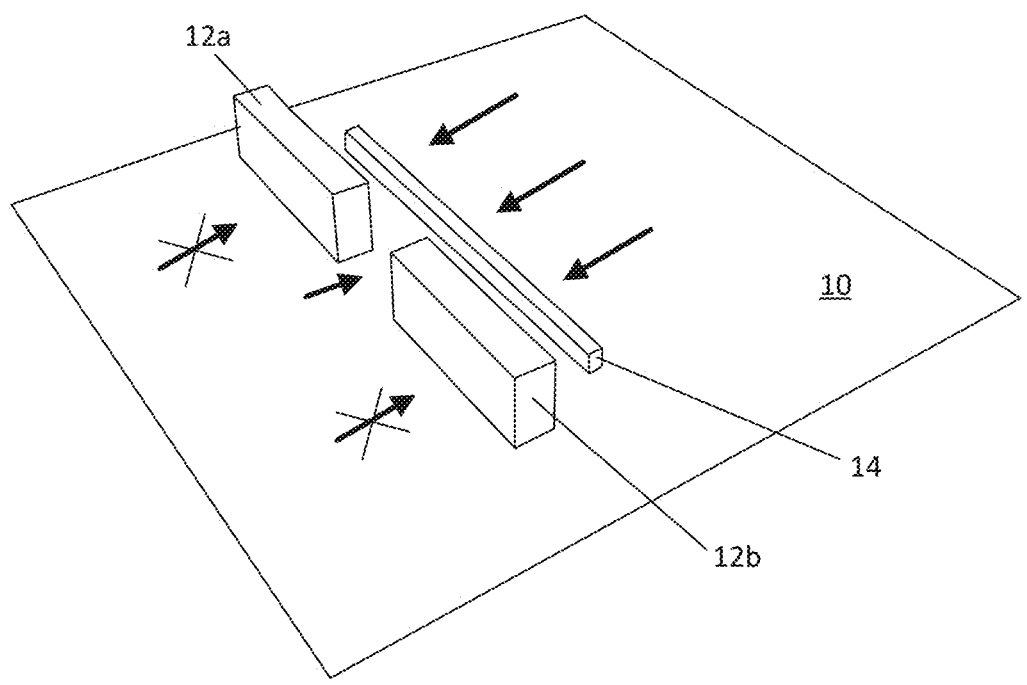
FIG. 1 is a schematic diagram illustrating the diffusion of adatoms across a surface of a substrate during a selective area growth, SAG, process in the presence of shadow walls according to a comparative example.

Directional terms such as "top", "bottom", "left", "right", "above", "below", "horizontal" and "vertical" are used herein for convenience of description and relate to the orientation shown the drawings. For the avoidance of any doubt, this terminology is not intended to limit orientation in an external frame of reference.

The abbreviation "SEM" refers to scanning electron microscopy. The abbreviation "SAG" refers to selective area growth.

The term "superconductor" refers to a material which becomes superconductive when cooled to a temperature below a critical temperature, Tc, of the material. The use of this term is not intended to limit the temperature during fabrication of a device.

The term "adatom" as used herein refers to an atom which is adsorbed on a surface.

A "directional deposition process" is a process that uses a directed beam of material or a precursor of the material to deposit material on a surface. In a directional deposition process, the position at which material is adsorbed onto the surface is determined by the direction of the beam. The beam has a constant azimuth relative to the surface, or in other words, the direction of the beam relative to the surface is fixed during the deposition. Examples of processes which may be used to achieve directional deposition include molecular beam epitaxy, thermal evaporation, and electron beam evaporation.

Non-directional deposition processes either do not use a directed beam, or use a directed beam which does not have a constant azimuth relative to the surface.

Examples of non-directional deposition processes which do not use a directed beam include chemical vapour deposition processes such as atomic layer deposition and metal-organic vapour deposition.

Non-directional deposition may alternatively be achieved using a directed beam if the azimuth of the beam is varied continuously during the deposition. The azimuth of the beam may be varied by rotating the substrate during the deposition, for example.

The content of all documents cited herein is hereby incorporated by reference in its entirety.

Described herein are shadow walls useful for controlling deposition of material using directional deposition processes. A shadow wall is a structure which is configured to block the path of a beam of the material during the directional deposition, thereby creating a shadow region in which that material is not deposited. Various shadow wall structures have been proposed in WO2019/099171 A2, U.S. Ser. Nos. 16/246,289; 16/258,025; and PCT/US2019/064705.

One particular use of shadow walls is in the fabrication of semiconductor-superconductor hybrid devices for use in quantum computing. The fabrication of such a device may involve growing a semiconductor component on a crystalline substrate using a non-directional process, and then subsequently forming a superconductor component over the semiconductor component using a directional process. Precise control over where the superconductor material is deposited is desirable, and this may be achieved using shadow walls. The shadow walls may be fabricated before growing the semiconductor component. Although the concepts provided herein will be described with reference to a semiconductor-superconductor hybrid device, it is to be appreciated that these concepts are applicable to other types of device.

Prior shadow walls took the form of blocks arranged on the substrate. The inventors have observed that shadow walls in the form of blocks may have detrimental effects on non-directional processes used to grow, for example, semiconductor components. These effects are illustrated in FIG. 1.

FIG. 1 is a simplified schematic diagram showing shadow walls 12a, 12b and a semiconductor component in the form of a nanowire 14 arranged on a substrate 10. The shadow walls 12a, 12b take the form of blocks of dielectric material, which were fabricated before growing the semiconductor component.

Growth of the semiconductor component is performed in a vacuum chamber. A beam of material for growing the semiconductor component are supplied to the vacuum chamber from a source. The position in which growth occurs is controlled by a mask arranged on the substrate. This approach to growth of components may be referred to as selective area growth, SAG.

The substrate may be rotated whilst the beam is applied. In such an example, the deposition of the material for growing the semiconductor component is thus non-directional, because the azimuth of the beam relative to the substrate varies during the deposition.

During growth of the semiconductor component, atoms from the beam are adsorbed onto the surface of the substrate. Adsorbed atoms are referred to as adatoms. Adatoms may diffuse on the surface of the substrate, performing a random walk. The random walk covers a distance which is referred to as the surface diffusion length of the adatoms. An adatom remains on the surface for a certain time period, referred to as its surface lifetime, after which period the adatom either desorbs from the surface, or becomes incorporated into a crystal at some position on the surface. The flow rate, also referred to as flux, of adatoms across the surface is one parameter which may influence the growth of the semiconductor.

As shown in FIG. 1, the shadow walls 12a, 12b restrict adatom flux over the surface of the substrate 10. Adatom flux is illustrated by arrows in FIG. 1. As is shown in FIG. 1, the parts of the semiconductor component 14 which face the shadow walls 12a, 12b receive less flux than portions which do not face the shadow walls 12a, 12b. This results in anisotropic growth of the semiconductor component.

Anisotropic growth makes it difficult to fabricate a semiconductor component with the precision necessary for a quantum computing device. The optimisation of crystal growth conditions may also be made difficult, because growth parameters may vary depending on the arrangement of the shadow walls, rather than being controlled solely by fundamental growth parameters. Another consideration is that individual crystal growth apparatuses will supply material from different relative positions, meaning that optimisation of growth conditions per apparatus may be needed.

One approach to mitigating effects on adatom flux is to provide a relatively large space (e.g. at least 1.5 μm) between the shadow walls and the intended position of the semiconductor component. However, this introduces an additional constraint on how close together components can be positioned, and necessitates the use of tall shadow walls (e.g., shadow walls with heights greater than or equal to 1.8 μm) in order to cast a shadow over the desired portion of the semiconductor component. Tall walls tend to be more fragile and more difficult to fabricate than shorter walls.

Provided herein are shadow walls which may address one or more of these drawbacks.

Figure 2:
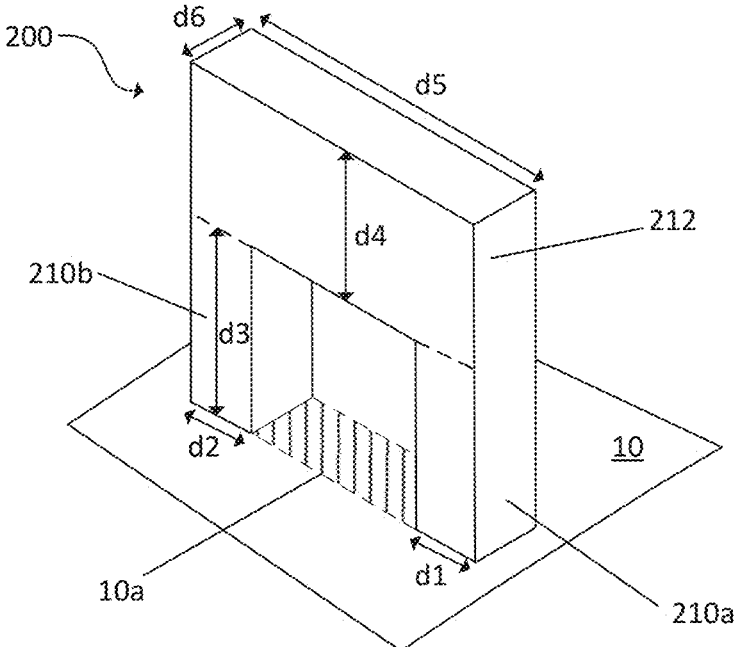
FIG. 2 shows a schematic perspective view of a shadow wall according to the present disclosure.

FIG. 2 shows a schematic diagram of a shadow wall 200 of the present disclosure. The illustrated shadow wall 200 includes two base portions 210a, 210b and a bridge portion 212. A scanning electron microscopy, SEM, image of a shadow wall of the type shown in FIG. 2 is provided in FIG. 3.

The two base portions 210a, 210b are arranged on a substrate 10. Base portions 210a, 210b are in the form of pillars, extending upwardly from the substrate 10. The base portions 210a, 210b are configured to support the bridge portion 212.

The bridge portion 212 in the illustrated example spans the base portions 210a, 210b. The bridge portion 212 overhangs the substrate 10. In other words, a part of bridge portion 212 extends over a part 10a of the substrate 10 and is separated from the substrate 10 by a gap. During directional deposition of a material, the bridge portion 212 blocks the beam of material thereby creating the desired shadow region.

The dimensions d1, d2, d3, d4, d5 of the various portions of the shadow wall may be selected as appropriate depending upon the size of shadow desired. Widths d1, d2 of the base portions 210a, 210b are desirably as small as possible. The height d3 of the base portions 210a, 210b is typically less than or equal to 900 nm, and the overall height (d3+d4) of the shadow wall is typically less than or equal to 1.5 μm. The distance between the base portions may be in the range 300 nm to 3 μm. Dimensions d4, d5, d6 of the bridge portion may be adjusted as desired.

Figure 4:
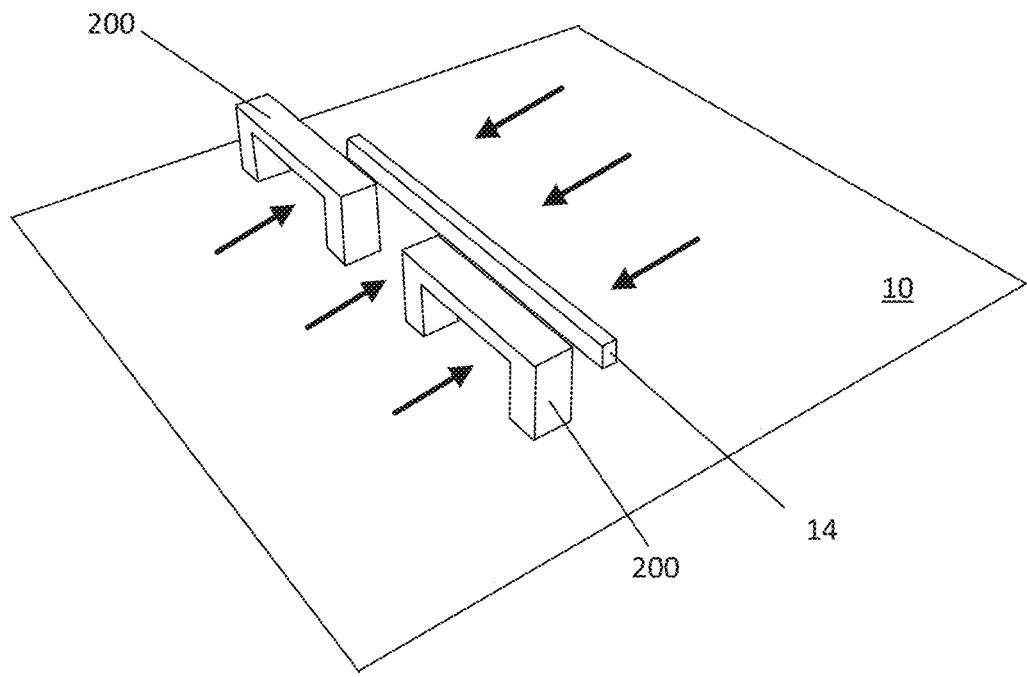
FIG. 4 is a schematic diagram illustrating the diffusion of adatoms across the surface of a substrate in a SAG process in the presence of a shadow wall as shown in FIG. 2.

The effects of shadow wall 200 are illustrated in FIG. 4. Since the bridge portion 212 overhangs the substrate 10, adatoms may pass under the bridge portion 212 during non-directional fabrication processes. The effect of shadow wall 200 on the diffusion of adatoms across the surface of the substrate 10 may therefore be reduced in comparison with a solid shadow wall 12a, 12b. Shadow walls 200 may therefore be arranged closer to the semiconductor component 14. For example, a spacing between the base portion of shadow wall 200 and an area for growing a semiconductor component may be as small as 200 nm. The height of the shadow wall 200 may also be reduced as a consequence, making the shadow wall less susceptible to damage and more stable during fabrication processes.

Various modifications may be made to the structure illustrated in FIG. 2. The configurations of the bridge portion 212 and base portions 210a, 210b may be varied independently from one another, allowing significant design flexibility.

The number, shape, relative positions, and dimensions of the base portions are not particularly limited provided that the base portions support the bridge portion and allow the bridge portion to overhang the substrate. Shapes and dimensions of individual base portions of a given shadow wall may be independently selected.

Base portions may have a width and thickness selected to be as small as possible, as this may allow the greatest adatom flux on the surface of the substrate during non-directional deposition processes.

The shape and dimensions of the bridge portion 212 may be varied as appropriate, depending on the desired shadow shape and the intended angle of incidents for the beam of material during directional deposition. For example, the bridge portion may include a taper and/or a projection for adjusting the shape of the shadow.

The distance between the substrate and the bridge portion may vary. For example, the bridge portion may be spaced from the substrate by a distance in the range 100 nm to 1 $\mu$m, e.g. 200 nm to 900 nm.

FIGS. 5a to 5d show SEM micrographs of various shadow walls, showing examples of the types of modifications which may be made to the shape of the shadow wall.

Figure 3:
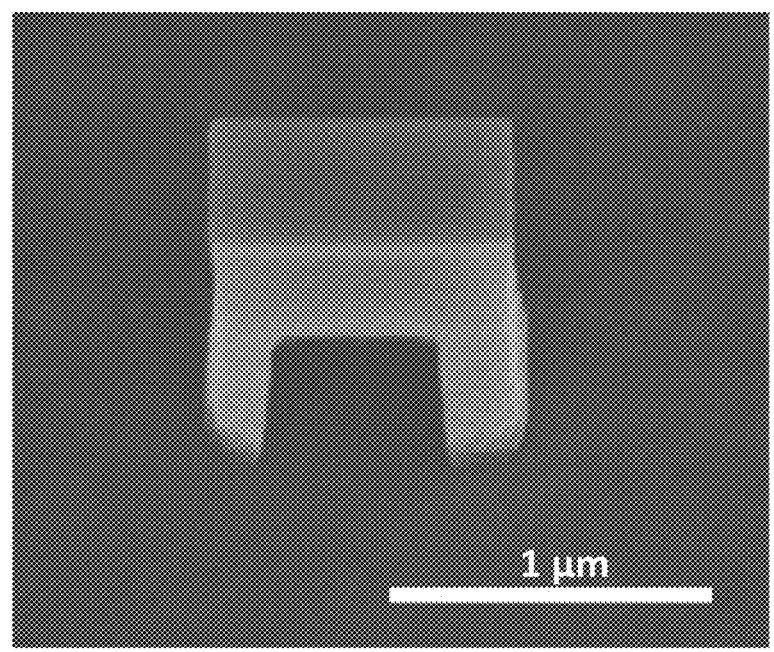
FIG. 3 is a scanning electron microscopy, SEM, micrograph of a shadow wall of the type shown in FIG. 2.
Figure 5A:
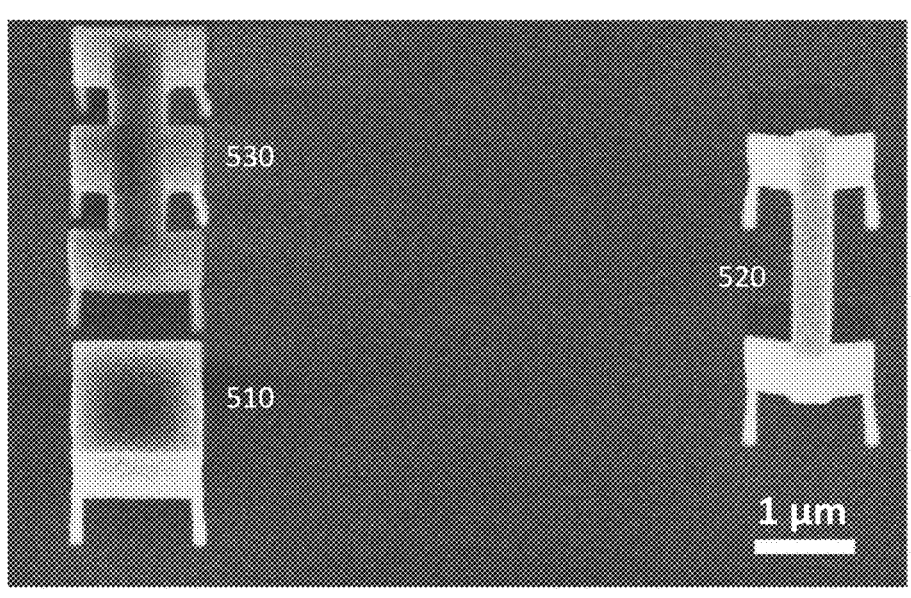
FIGS. 5a to 5d are SEM micrographs of various examples of shadow walls.

FIG. 5a shows a first shadow wall 510 which is similar in structure to that shown in FIG. 3, differing in that the base portions of the shadow wall 510 are proportionately thinner than the shadow wall of FIG. 3. By reducing the thickness of the base portions, the size of the gap under the bridge portion is increased. This may allow for a greater flux of adatoms under the bridge portion.

A second shadow wall 520 having a more complex configuration of the bridge portion is also shown in FIG. 5a. The bridge portion of shadow wall 520 includes a linear section with a respective pair of opposed projections extending from either side of the linear section at the end of the linear section. The bridge portion of shadow wall 520 has an "I"-shape when viewed in plan. A respective base section supports the end of each of the projections.

Also shown in FIG. 5a is a third shadow wall 530. Third shadow wall 530 is similar to second shadow wall 520, differing in that third shadow wall 530 includes a further pair of opposed projections arranged towards the middle of the linear section of the bridge portion. The further projections are supported by respective base sections. The inclusion of such projections and base sections along the length of a bridge section may be useful for supporting a bridge section which is relatively large by providing additional support for the bridge section along its length.

Figure 5B:
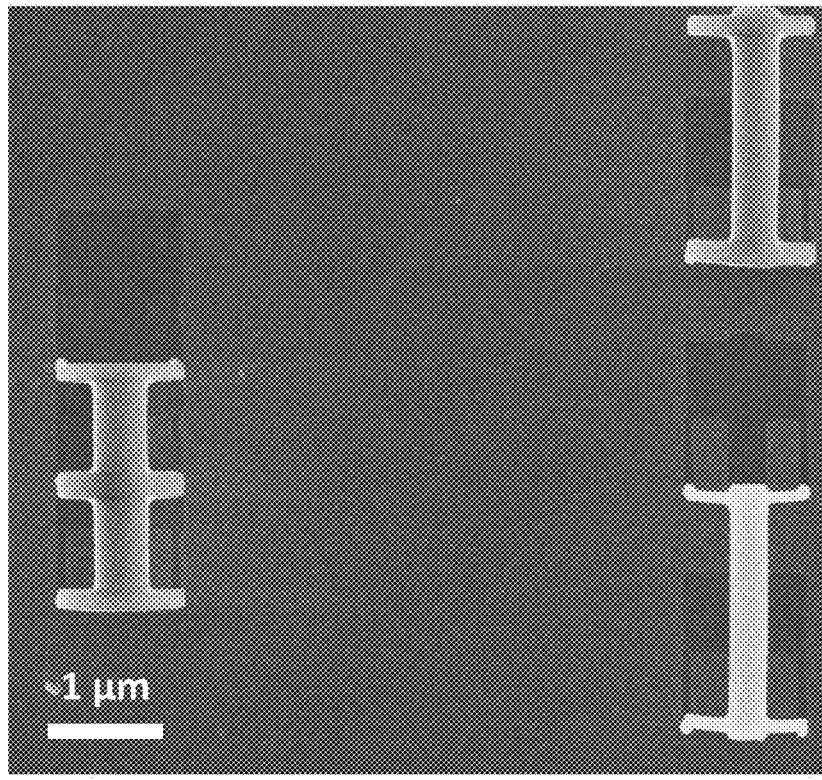

FIG. 5b shows further examples of shadow walls with "I"-shaped bridge portions, illustrating that the proportions of the linear section and projections may vary. This FIG. further shows the shadows cast by the shadow walls after applying electron beam evaporation. The darker regions are areas where no material was deposited. As may be seen, the size and shape of these regions vary depending on the configuration of the bridge portion.

Figure 5C:
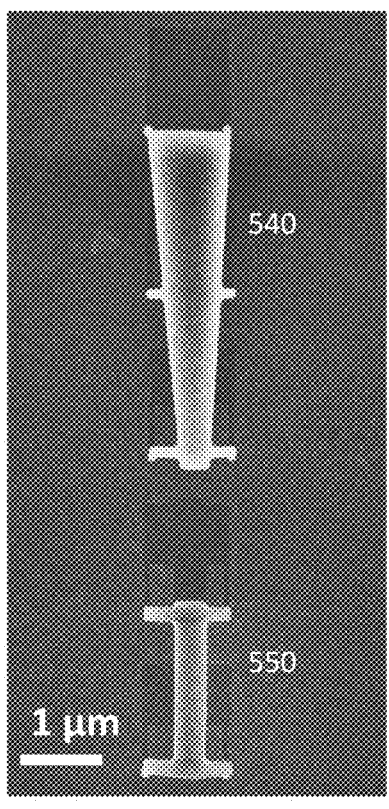

FIG. 5c shows another example shadow wall 540. Shadow wall 540 has a bridge portion which includes a tapered section having a generally triangular shape in plan. Pairs of opposed projections are provided on either side of the tapered section and points toward the narrow end of the taper and a mid-point of the taper. Each projection is supported by a respective base section. The wide end of the tapered section is also provided with a pair of supporting base sections.

FIG. 5c also shows a shadow wall 550 with an I-shaped bridge portion, to show the differences in shadow shape resulting from the differences in shape of the bridge portions. Shadow wall 540 casts a rectangular shadow, whereas shadow wall 550 casts a T-shaped shadow, with extensions at the end of each arm of the 'T' cast by the respective base portions.

Figure 5D:
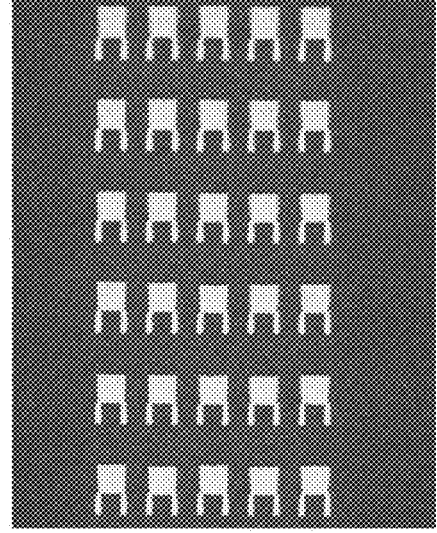

FIG. 5d is an SEM micrograph showing a plurality of shadow walls of the type described with reference to FIG. 2 arranged in ranks. This demonstrates that it is possible to form a plurality of shadow walls on a single substrate. Complex directional deposition patterns may be achievable through the use of a plurality of shadow walls.

Figure 6:
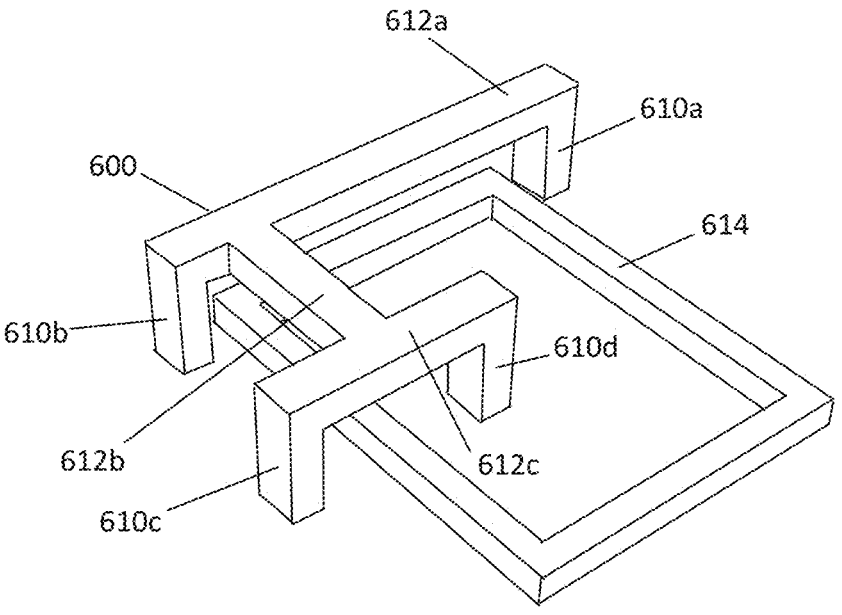
FIG. 6 is a schematic perspective view of an example branched shadow wall overhanging a nanowire.

FIG. 6 is a schematic diagram illustrating a further degree of design freedom made possible by the shadow wall structure provided herein.

FIG. 6 shows a shadow wall 600 and a semiconductor component 614. The semiconductor component 614 is in the form of a loop.

Shadow wall 600 of this example comprises four base portions 610a, 610b, 610c, 60d and a bridge portion 612a, 612b, 612c. The bridge portion of this example is branched and has an "H" shape in plan. The bridge portion includes first and second linear sections 612a, 612c. The first linear portion bridges a first pair of base portions 610a, 610b. The second linear section 612c is parallel to the first linear portion 612a, and bridges a second pair of base portions 610c, 610d. A third linear section 612b which is orthogonal to the first and second linear portions 612a, 612c connects the first and second linear section 612, 612C.

As shown in FIG. 6, the bridge portion 612a, 612b, 612c overhangs the semiconductor component 614. By providing a bridge portion which overhangs the substrate, it is made possible to fabricate a semiconductor component which passes underneath the bridge portion. This may allow for the fabrication of semiconductor-superconductor hybrid devices with more complex topologies.

Figure 7:
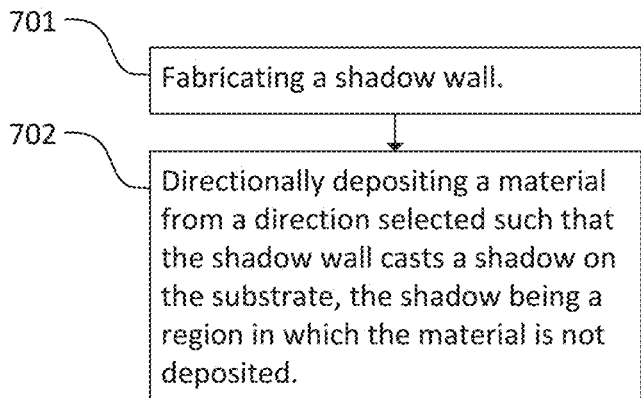
FIG. 7 is a flow chart outlining a method of fabricating a device.

A method of fabricating a device will now be described with reference to FIG. 7.

At block 701, a shadow wall as described herein is fabricated on a substrate. Any suitable fabrication method may be used. One illustrative method of fabricating a shadow wall will be described later with reference to FIG. 8.

The substrate may be any structure on which the device is to be constructed. The substrate typically comprises a wafer of semiconductor material. A wafer is a single crystalline piece of material. One example wafer material is indium phosphide, which is a high band-gap semiconductor. Other examples of wafer materials include gallium arsenide, indium antimonide, indium arsenide, and silicon. The substrate may be a more elaborate workpiece, further comprising additional structures arranged on or over the wafer. The substrate may include layers of two or more materials. The substrate may for example include a dielectric mask for a selective area growth process, arranged on a substrate.

After fabricating the shadow wall, one or more components may be fabricated on the substrate using non-directional deposition techniques. Examples of such components include semiconductor components, dielectric components, and ferromagnetic insular components.

For example, one or more components may be fabricated on the substrate by selective area growth, SAG. The one or more components may comprise a semiconductor component.

Selective area growth involves forming a mask on the substrate which leaves exposed regions where the component is to be grown. The mask may comprise an amorphous dielectric material, such as a silicon oxide or silicon nitride. Then, in a growth phase, growth conditions are selected such that crystal growth occurs selectively on regions of the substrate that are left exposed by the mask.

Techniques for selective area growth are disclosed in e.g., G. J Davies *Proc. SPIE* 2140, Epitaxial Growth Processes, 58 (doi:10.1117/12.175795) M Fahed, Doctoral thesis: Selective area growth of in-plane III-V nanostructures using molecular beam epitaxy, 2016 (http://www.theses.fr/2016LIL10114); Fukui et al, Appl. Phys. Lett. 58, 2018 (1991) (doi: 10.1063/1.105026); P. Aseev et al. Nano Letters 2019 19 (1), 218-227, doi: 10.1021/acs.nanolett.8b03733.

In examples where selective area growth is used, the mask for selective area growth may be formed before fabricating the shadow walls. In other words, the shadow walls may be arranged on a mask layer.

At block 702, material is deposited directionally on the substrate from a direction selected such that the shadow wall casts a shadow on the substrate, the shadow being a region in which the material is not deposited. The beam has a fixed azimuth, i.e. angle and orientation, relative to the surface of the substrate selected such that the shadow wall prevents deposition on a surface portion of the device structure within a shadow region defined by the shadow wall, by blocking the path of the beam.

The material may be selected as desired. Examples include superconductor materials, semiconductor materials, and dielectrics.

Various types of directional deposition are known. Molecular beam epitaxy or electron gun epitaxy may be used, for example.

Examples of superconductor materials include aluminium, lead, indium, and tin. Such materials may be stored as a solid in source cells and evaporated in order to be projected at the device.

One or more additional directional depositions may follow. The material(s) deposited in the additional deposition(s) may be the same material as in the first directional deposition, or one or more different materials. In one example, a superconductor may be deposited in a first directional deposition, and a dielectric may be deposited in a second directional deposition. The azimuth relative to the substrate from which the material is deposited may be the same or different for each deposition. By performing two or more directional depositions, each from different azimuths, different patterns can be created on the device using the same shadow walls.

After material has been deposited, the shadow wall may be removed. The removal may be mechanical removal, or a chemical etch. Mechanical methods such as sonication may be preferred in some implementations.

Removal of the walls by sonication may comprise placing the device in a liquid bath and applying ultrasonication. Other mechanical methods may be used.

The removal may be partial removal. For example, footprints on the wafer 10 corresponding to the base portions may remain. Such footprints are generally well-tolerated in any subsequent fabrication steps.

Figure 8:
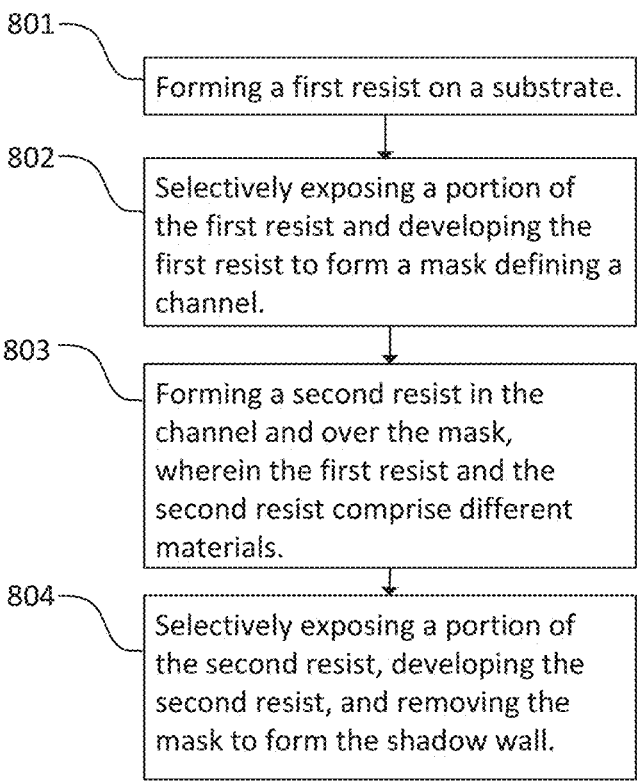
FIG. 8 is a flow chart outlining a method of fabricating a shadow wall.
Figure 9A:
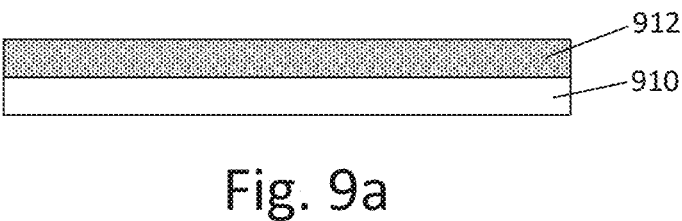
FIGS. 9a to 9d are schematic cross-sections of work-pieces obtained at various stages of the method of FIG. 8.
Figure 9B:
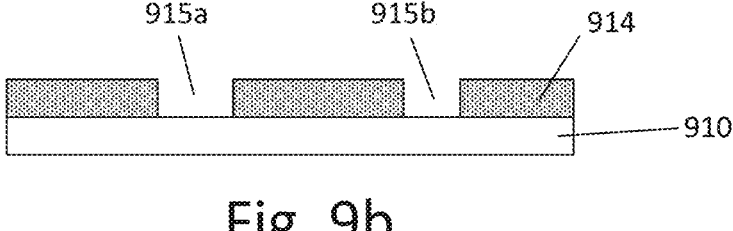
Figure 9C:
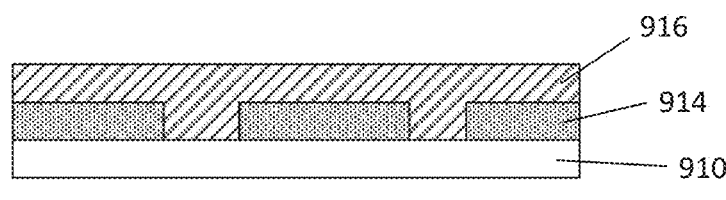
Figure 9D:
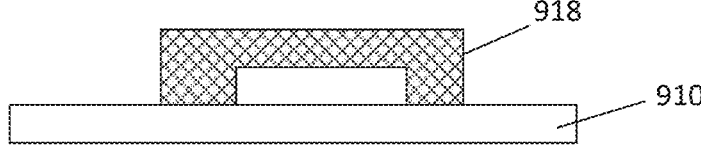

A method of fabricating a shadow wall of the present disclosure will now be described with reference to FIGS. 8 and 9 simultaneously. FIG. 8 is a flow chart outlining the method, and FIG. 9 shows schematic cross-sections of workpieces obtained at various steps of the method.

At block 801, a first resist 912 is formed on a substrate 910 to produce the workpiece illustrated in FIG. 9(*a*). The first resist 912 may be applied using any suitable technique, for example spin-coating or spray coating. The first resist will be used in a subsequent step to form a mask for controlling fabrication of the base portions of the shadow wall.

Substrate 910 is illustrated as a simple wafer of semiconductor material. In variants, a more complex substrate may be used. For example, the substrate may include a dielectric mask arranged on a wafer. The dielectric mask may comprise a silicon oxide or a silicon nitride. In such an example, the first resist 912 is formed on the dielectric mask.

The first resist may be an electron beam resist, and preferably a positive electron beam resist. A positive electron beam resist is one which becomes more soluble in a developer solvent once exposed to an electron beam. Selecting a positive resist as the first resist may simplify the fabrication of the shadow wall.

Examples of positive electron beam resists include acrylate polymers and copolymers. For example, the positive electron beam resist may be a poly(methylmethacrylate), a methylmethacrylate-methacrylic acid copolymer, or a copolymer of chloromethyl methacrylate and methylstyrene. Copolymers of chloromethyl methacrylate and methylstyrene are commercially-available under the trade name CSAR. In particular, the first resist may be a poly(methylmethacrylate), PMMA.

Although photolithography could in principle be used, electron beam lithography is preferred due to its higher resolution.

The thickness of the first resist 912, more specifically the thickness of mask 914 which will be formed from the first resist, will define the height of base portions of the shadow wall.

At block 802, a portion of the first resist 912 is selectively exposed and then the first resist 912 is developed to form a mask 914 defining a channel. This yields a structure as illustrated in FIG. 9(*b*). In the illustrated example, two channels 915a, 915b are formed in the mask 914. The channels 915a, 915b will be used subsequently in the formation of the base portions of the shadow wall. Mask 914 may alternatively be referred to as a supporting layer, since in a subsequent step the mask supports the bridge portion of the shadow wall during fabrication of the bridge portion.

When exposing the first resist, selected areas are exposed such that after developing the resist the resultant mask will define the channels. When a positive resist is used, the areas which will correspond to the channels are exposed.

The exposure and development conditions may be selected as appropriate based on the resist chosen. For example, where the first resist comprises a poly(methylmethacrylate), a developer comprising a mixture of methyl isobutyl ketone and isopropyl alcohol may be used.

At block 803, a second resist 916 is formed in the channel 915a, 915b and over the mask 914 to provide a workpiece as illustrated in FIG. 9(*c*). The materials used as the first resist and the second resist are different.

The second resist 916 may be applied by any suitable technique, for example spin-coating or spray-coating.

The second resist 916 is typically an electron beam resist, again due to the higher resolutions achievable using electron beam lithography compared to alternative techniques.

The second resist 916 is typically a negative electron beam resist, i.e. a resist which becomes less soluble in a developer when exposed to the electron beam. This is to minimise the area to be exposed. Portions of the second resist will be converted into the shadow wall.

At block 804, the second resist 916 is selectively exposed, the second resist 916 is developed, and the mask 914 is removed in order to form a shadow wall 918 as shown in FIG. 9(*d*).

When the second resist 916 comprises a negative resist, exposing the second resist involves exposing the parts of the second resist 916 which are in the channels 915*a*, 915*b*. These portions form the base portions of the shadow wall. The shape of the bridge portion of the shadow wall is defined by exposing corresponding parts of the second resist.

The second resist may be selected such that the shadow wall will comprise an inorganic material. The second resist may, for example, comprise a silsesquioxane such as hydrogen silsesquioxane ("HSQ") or methyl silsesquioxane ("MSQ"). Exposing an HSQ to an electron beam converts the HSQ into a silicon oxide.

Desirably, the second resist 916 is developed using a developer which does not attack the mask 914. In an example where the first resist comprises an acrylate polymer or copolymer such as a poly(methylmethacrylate), the developer for the second resist may comprise a base. The base may comprise a base, for example tetramethylammonium hydroxide ("TMAH"), potassium hydroxide or sodium hydroxide. Various developers are commercially available. Illustrative TMAH-based developers are available under the trade names MF-321 and MF-322.

Removing the mask 914 may comprise stripping the first resist. Any appropriate technique for resist stripping may be used, provided that the shadow wall remains intact. Examples include the use of a solvent in combination with critical point drying, or the use of an oxygen plasma. In implementations where a poly(methylmethacrylate) is used as the first resist, the solvent may be acetone, for example.

In accordance with this method, the shapes of the base portion(s) and the bridge portion(s) of the shadow wall can be defined independently of one another. The mask formed by the first resist defines the shape of the base portion(s), and selective exposure of the second resist allows the shape of the bridge portion to be defined. This may allow significant freedom when designing the shape of the shadow walls, thereby allowing for the fabrication of more elaborate devices.

It will be appreciated that the above embodiments have been described by way of example only.

More generally, according to one aspect disclosed herein, there is provided a shadow wall for controlling directional deposition of a material, wherein the shadow wall is arranged on a substrate; wherein the shadow wall comprises a base portion and a bridge portion; wherein the base portion is arranged on the substrate and is configured to support the bridge portion; and wherein the bridge portion overhangs the substrate. Since the bridge portion overhangs the substrate, adatoms may diffuse under the bridge portion during non-directional deposition processes. This may avoid undesirable effects on non-directional deposition.

The shadow wall may comprise at least two base portions, and wherein the bridge portion bridges the at least two base portions. Although shadow walls with a single base portion having a T or inverted L shape in cross-section are contemplated, providing two or more base portions may allow larger bridge portions to be supported. For example, a shadow wall may have 2 to 6 base portions.

The bridge portion may be branched. For example, the bridge portion may have an 'H', 'I', or 'T' shape when viewed in plan. The shape of the bridge portion may be selected as desired, allowing for fine control over directional deposition processes.

The bridge portion may include a taper and/or a protrusion. Particularly, the bridge portion may have a taper when viewed in a plan view. Varying the geometry of the bridge portion controls the shape of the shadow cast.

The bridge portion may be spaced from the substrate by a height in the range 200 nm to 900 nm. Providing a space of at least 200 nm between the substrate and the bridge portion may allow better flow of adatoms under the bridge portion during non-directional deposition processes. Smaller spaces may be used. Shadow walls become increasingly fragile as height increases, and limiting the space to a height of 900 nm may improve robustness.

The shadow wall may be formed of an inorganic material, for example, a silicon oxide. Inorganic materials may have greater tolerance to elevated temperatures than organic materials. A two-stage lithography process, using a hydrogen silsesquioxane electron beam resist in the second stage, allows convenient fabrication of shadow walls comprising a silicon oxide.

The substrate may comprise a wafer. The substrate may further comprise a dielectric mask arranged on the wafer. The dielectric mask may comprise a silicon oxide or a silicon nitride. The base portions may be arranged on the dielectric mask.

The mask may include an opening for allowing formation of a component. The mask may be a mask for controlling selective area growth. A base portion of the shadow wall may be spaced from the opening by a horizontal distance of less than or equal to 1.5 μm, for example, a distance in the range 200 to 800 nm. Since adatoms may flow under the bridge portion, the shadow wall may be arranged close to the location of a component without interfering with growth of the component.

A further component may be arranged on the substrate. The further component may be a semiconductor component, optionally in the form of a nanowire. The bridge portion may overhang the further component. This may provide more options for controlling directional deposition onto the further component. Additionally or alternatively, a base portion of the shadow wall may be spaced from the further component by a horizontal distance less than or equal to 1.5 μm, for example, a distance in the range 100 to 800 nm.

In another aspect, there is provided a method of fabricating a device, which method comprises: fabricating a shadow wall as defined above; and directionally depositing a material from a direction selected such that the shadow wall casts a shadow on the substrate, the shadow being a region in which the material is not deposited. The shadow walls provided herein are useful for controlling the directional deposition of materials. When a beam of material has an appropriately selected angle of incidence, the shadow wall blocks deposition of material in a shadow region.

The method may further comprise, before depositing the material, fabricating a component on the substrate. The fabricating may comprise a non-directional deposition process, which may be any of the non-directional deposition processes identified herein. Since adatoms may diffuse across the surface of the substrate under the bridge portion during non-directional deposition processes, the effect of the shadow wall on such processes is reduced. Alternatively or additionally, a component may be fabricated on the substrate by non-directional deposition after depositing the material.

The component may be a semiconductor component. Fabricating the semiconductor component may comprise growing the semiconductor component by selective area growth.

The semiconductor component may comprise a nanowire or a network of nanowires. A nanowire is an elongate member having a nano-scale width, and a length-to-width ratio of at least 10, or at least 50, or at least 100. A typical example of a nanowire has a width in the range 10 to 500 nm, optionally 50 to 100 nm or 75 to 125 nm. Lengths are typically of the order of micrometres, e.g. at least 1 $\mu$m, or at least 10 $\mu$m.

Illustrative examples of semiconductor materials include III-V semiconductors, particularly those of Formula I:

$$InAs_xSb_{1-x} \tag{1}$$

where X is in the range 0 to 1. In other words, semiconductor component 16 may comprise indium antimonide (x=0), indium arsenide (x=1), or a ternary mixture comprising 50% indium on a molar basis and variable proportions of arsenic and antimony (0<x<1). Materials in this class have favourable properties in quantum computing devices, particularly, good compatibility with superconductor materials such as aluminium. Values of x in the range 0.35 to 0.8 may provide particular advantages for some implementations.

At least part of the component may be fabricated below the bridge portion, such that the bridge portion overhangs the component. Since there is a space between the bridge portion and the substrate, components may be fabricated in this space. This may open up further design options for devices.

The material may comprise a metal. The material may be a superconductor material. A "superconductor material" is a material which becomes superconductive when cooled to a temperature below a critical temperature, Tc, of the material. Examples of superconductor materials include aluminium, lead, indium, and tin. Aluminium may be preferred for some implementations.

The material may be provided as a solid in a source cell and then evaporated in order to be projected in the direction.

The material may be a dielectric. Examples of dielectrics which may be deposited directionally include silicon monoxide.

The method may include directionally depositing material from two or more directions sequentially, each direction being selected such that the shadow wall casts a shadow on the substrate. By performing multiple directional deposition steps, more complex patterns of material on the substrate may be achieved.

The method may include directionally depositing two or more materials sequentially. The directions selected for each deposition may be the same or different. In an example, a superconductor material is deposited first, and then a dielectric is deposited over the superconductor component.

The method may further comprise, after depositing the material, at least partially removing the shadow wall. Shadow walls as provided herein are supported by base potions. Since the base portions are relatively small in comparison to the case where a monolithic block is used, the present shadow walls may be easier to remove.

The shadow wall may be removed mechanically. One useful technique for mechanical removal of shadow walls is sonication. Alternatively, the shadow wall may be removed by a chemical etch.

Another aspect provides method of fabricating a shadow wall on a substrate, the shadow wall comprising a base portion and a bridge portion, which method comprises: forming a first resist on the substrate; selectively exposing a portion of the first resist and developing the first resist to form a mask defining a channel; forming a second resist in the channel and over the mask, wherein the first resist and the second resist comprise different materials; selectively exposing a portion of the second resist, developing the second resist, and removing the mask to form the shadow wall; wherein the base portion is formed in the channel; wherein the base portion supports the bridge portion; and wherein the bridge portion overhangs the substrate. This technique allows the convenient fabrication of shadow walls as provided herein. The shapes of the base portion and bridge portion may be controlled independently from one another.

The first and second resists may be electron beam resists. Electron beam lithography may allow higher resolution than photolithography.

The first resist may be a positive electron beam resist, and the second resist may be a negative electron beam resist. This may minimise the areas to be exposed in each exposing step, thereby improving the speed at which the method can be performed.

The positive electron beam resist may be selected from acrylate polymers and copolymers. For example, the positive electron beam resist may be selected from a poly (methylmethacrylate), a methylmethacrylate-methacrylic acid copolymer or a copolymer of chloromethyl methacrylate and methylstyrene.

The negative electron beam resist may be selected from hydrogen silsesquioxane and methyl silsesquioxane.

In an example, the first resist may comprise a poly (methylmethacrylate) and the second resist may comprise a hydrogen silsesquioxane. This combination of resists has been investigated, and readily allowed the formation of shadow walls having the structure described herein.

Developing the second resist may comprise developing the second resist using a base. The base may be selected from tetramethylammonium hydroxide, sodium hydroxide, and potassium hydroxide. These developers may be effective for developing a hydrogen silsesquioxane resist in the presence of a further resist such as poly(methylmethacrylate) without removing the further resist.

The method may further comprise stripping the mask, for example using a solvent or an oxygen plasma. In implementations where a solvent is used, the solvent may be removed using critical point drying.

Other variants or use cases of the disclosed techniques may become apparent to the person skilled in the art once given the disclosure herein. The scope of the disclosure is not limited by the described embodiments but only by the accompanying claims.

The invention claimed is:

1. A method of fabricating a device, which method includes:

fabricating a shadow wall including a base portion and a bridge portion on a substrate, wherein the base portion is arranged on the substrate and configured to support the bridge portion, and wherein the bridge portion overhangs the substrate; and directionally depositing a material from a direction selected such that the shadow wall casts a shadow on the substrate, the shadow being a region in which the material is not deposited, wherein the material is deposited via a directed beam of material, and wherein the directed beam has a constant azimuth relative to a surface of the substrate during deposition.

2. The method according to claim 1, wherein the base portion is one of at least two base portions of the shadow wall, and wherein the bridge portion bridges the at least two base portions.

3. The method according to claim 1, wherein the bridge portion is branched.

4. The method according to claim 1, wherein the bridge portion includes a taper and/or a protrusion.

5. The method according to claim 1 further including, before depositing the material, fabricating a component on the substrate.

6. The method according to claim 5, wherein the component is a semiconductor component.

7. The method according to claim 5, wherein at least part of the component is fabricated below the bridge portion, such that the bridge portion overhangs the component.

8. The method according to claim 1, wherein the material is a superconductor material.

9. The method according to claim 1, further including, after depositing the material, at least partially removing the shadow wall.

10. A method of fabricating a device, which method includes:

fabricating a shadow wall on a substrate, the shadow wall including a base portion and a bridge portion by:

forming a first resist on the substrate, the substrate including a wafer and a dielectric mask for controlling selective area growth arranged on the wafer, the dielectric mask including an opening;

selectively exposing a portion of the first resist and developing the first resist to form a mask defining a channel;

forming a second resist in the channel and over the mask, wherein the first resist and the second resist include different materials; and selectively exposing a portion of the second resist, developing the second resist, and removing the mask defining the channel to form the shadow wall; and directionally depositing a material from a direction selected such that the directionally deposited material is not deposited in a region defined by a shadow cast on the substrate by the shadow wall, wherein the base portion is formed in the channel;

the base portion supports the bridge portion;

the base portion is spaced from the opening by a distance of less than or equal to 1.5 μm;

the bridge portion overhangs the substrate;

the material is deposited via a directed beam of material; and the directed beam has a constant azimuth relative to a surface of the substrate during deposition.

11. The method according to claim 10, wherein the first resist is a positive electron beam resist, and wherein the second resist is a negative electron beam resist.

12. The method according to claim 11, wherein the positive electron beam resist includes one or more of poly (methylmethacrylate), a methylmethacrylate-methacrylic acid copolymer, and a copolymer of chloromethyl methacrylate and methylstyrene.

13. The method according to claim 12, wherein the first resist includes a poly(methylmethacrylate) and the second resist includes a hydrogen silsesquioxane.

14. The method according to claim 10, wherein removing the mask includes stripping the mask using an oxygen plasma.

* * * * *